United States Patent [19]
Odell

[11] 4,063,113
[45] Dec. 13, 1977

[54] LOGIC TRANSFER CIRCUIT EMPLOYING MOS TRANSISTORS

[75] Inventor: Alexander Douglas Odell, Great Dunmow, England

[73] Assignee: International Standard Electric Corporation, New York, N.Y.

[21] Appl. No.: 696,166

[22] Filed: June 14, 1976

[30] Foreign Application Priority Data

Aug. 19, 1975 United Kingdom ............ 34407/75

[51] Int. Cl.² .................. H03K 19/08; H03K 19/20; H03K 3/353; G11C 19/00
[52] U.S. Cl. ............................ 307/205; 307/208; 307/221 C; 307/224 C; 307/251; 307/279; 307/DIG. 1
[58] Field of Search ......... 307/205, 208, 214, 221 C, 307/224 C, 238, 251, 279, DIG. 1, 220 C, 289, 291

[56] References Cited

U.S. PATENT DOCUMENTS

| | | | |
|---|---|---|---|
| 3,593,036 | 7/1971 | Ma et al. | 307/279 X |
| 3,870,897 | 3/1975 | Hatsukano et al. | 307/208 |

FOREIGN PATENT DOCUMENTS

| | | | |
|---|---|---|---|
| 2,029,729 | 1/1971 | Germany | 307/221 C |

Primary Examiner—John S. Heyman
Assistant Examiner—Larry N. Anagnos
Attorney, Agent, or Firm—John T. O'Halloran; Peter C. Van Der Sluys; Vincent B. Ingrassia

[57] ABSTRACT

This relates to an MOS logic synchronizing circuit operating with a single phase clock waveform. A logic inverter has two parallel-connected switching MOST's, the gate of one (M4) being connected to clock and the gate of the other (M2) being coupled to the logic input via the source-drain path of a third MOST (M1) whose gate is connected to clock. Input signal change is delayed by a full clock period.

9 Claims, 11 Drawing Figures

LOGIC TRANSFER CIRCUIT EMPLOYING MOS TRANSISTORS

BACKGROUND OF THE INVENTION

This invention relates generally to logic circuits and, more particularly, to a logic transfer circuit including two switching devices controlled by a single phase clock.

In the solution of most complex logic problems the ability to carry out certain functions in a synchronous, step-by-step manner is an important, if not essential, requirement. This can be achieved by employing a three-phase interleaved clock pulse system having overlap between successive phases, or by a two phase clock pulse system without overlap but with some form of information storage between phases. The need for storage is exemplified by the two gate capacitances per bit in conventional dynamic MOS shift registers and by the two flip-flops in master-slave arrangements.

SUMMARY OF THE INVENTION

It is an object of the present invention to realize synchronous operation with a single-phase clock system.

According to a broad aspect of the invention there is provided a logic transfer circuit including at least two switching devices controlled by a single phase clock, comprising: a first switching device; a second switching device; means for applying a single phase clock pulse waveform to said first and second switching devices for rendering them alternately conducting and non-conducting; at least one logic input storage device; means for coupling an input logic signal to said logic input storage device via said first switching device when said first switching device is conducting, said storage device maintaining an input level transferred thereto during any one conducting period of said transfer circuit throughout the next non-conducting period when said storage device is isolated from said logic input; and logic output means controlled by said storage device and clamped by said second switching device such that if any change occurs in the input level during any one of said non-conducting periods, said output means is clamped at the pre-change level until the next non-conducting period.

The invention will be better understood from the following description, in conjunction with the accompanying drawings in which:

DESCRIPTION OF THE PREFERRED EMBODIMENT

Figure 1:
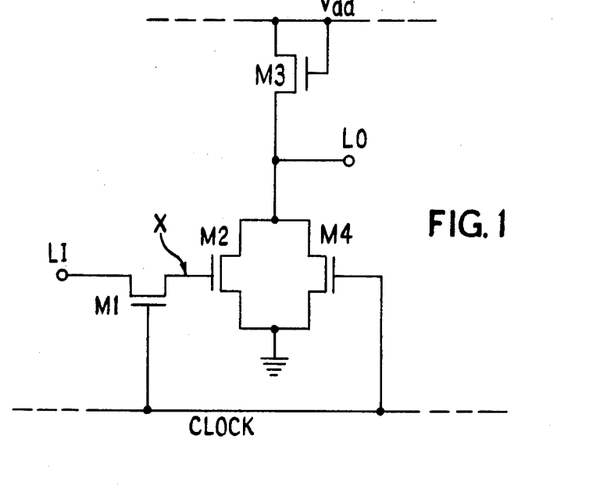
FIG. 1 shows a MOS logic synchronizing circuit embodying the invention.

FIG. 1 shows an integrated logic synchronizing circuit comprised of four N-channel MOS transistors. All of the subsequent description refers to N-channel devices, but P-channel devices could be employed.

The circuit shown in FIG. 1 utilizes a single-phase clock system in which the upper and lower levels of the clock pulse substitute for the two separate pulses in a two-phase system, storage being provided by a combination of flip-flop and gate capacity. An important feature of the system is that it is quasi-static; the limitation on minimum clock rate exhibited by conventional dynamic MOS logic does not therefore occur.

Logic input is at input terminal LI which is coupled via the source-drain path of MOS transistor M1 to the gate of MOS transistor M2. The source-drain path of the transistor M2 is in parallel with the source-drain path of MOS transistor M4, and logic output is at output terminal LO which is coupled between M2 and M4 and MOS transistor M3 connected as load transistor. Clock pulses of a single phase waveform are applied to the gates of the transistors M1 and M4.

Figure 2:
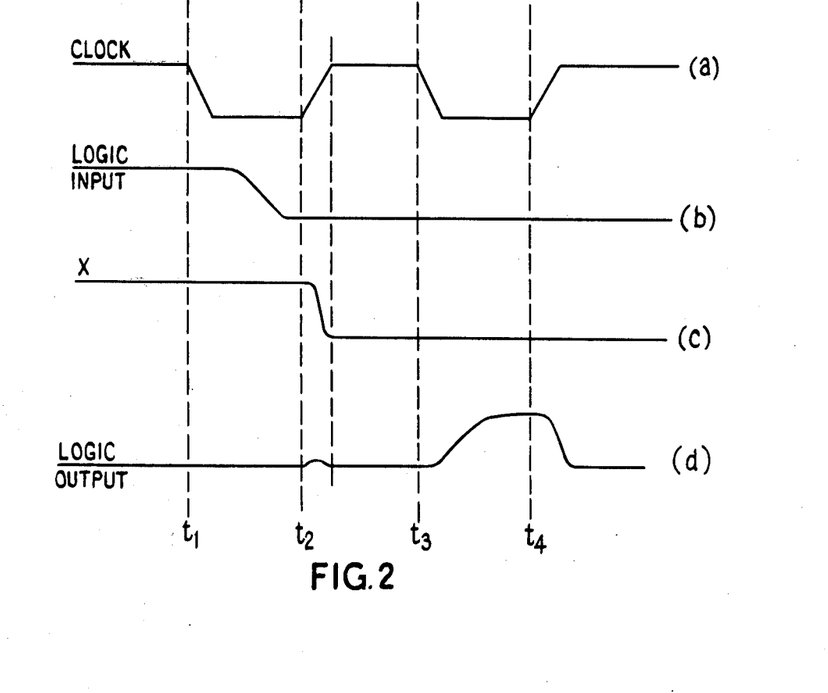
FIG. 2 shows waveforms concerned with operation of the circuit of FIG. 1.

The quiescent state of the clock is positive (FIG. 2a) (i.e. "high"). In this state M1 which functions as a transfer device, is conducting, and the point X will have been charged (FIG. 2c) to a value equal to the input signal (FIG. 2b) which is assumed to be also high. Both M2 and M4 will therefore be conducting at this time and the output (FIG. 2d) will be low.

At time $t_1$ the clock level falls, cutting off M1 and M4, but leaving the gate of M2 high. The output therefore remains low.

A change in the logic input signal will now have no effect on the output as long as it takes place while the clock is low. In FIG. 2b it is assumed that the input does in fact change to the low state during this time, i.e. after $t_1$ and before $t_2$.

When at $t_2$, the clock goes high, resulting in both M1 and M4 being rendered conducting, the new (low) input condition will be transferred, via M1, to the gate of M2 and current in M2 will fall. At the same time, however, the rising clock signal will cause current flow in M4, with M4 taking over from M2 in holding the output low. It is important that the output voltage does not rise, appreciably during this time, and the upper limit on clock rise time which this requirement proposes will be discussed in more detail later.

During the remainder of the high clock period between $t_2$ and $t_3$, the situation is similar to that prior to $t_1$, except that the gate of M2 is now low and the output is clamped by M4 alone. When the clock falls once more at $t_3$, therefore, the output rises to a high value. The change in input signal has accordingly been delayed by a full clock period.

Figure 3:
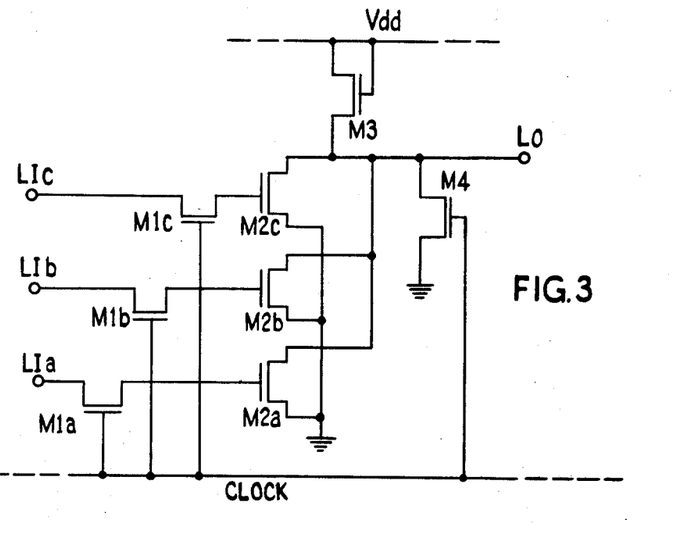
FIG. 3 shows a multiple input arrangement based on the circuit of FIG. 1.

FIG. 3 shows how further inputs can be added to the circuit of FIG. 1. A transfer device, M1a, M1b, M1c is needed on each input LIa, LIb, LIc, to ensure that all input signals are disconnected when the clock (applied to the gates of the transfer devices M1a, M1b, and M1c) is low, and each transfer device is coupled to the gate of an individual MOS transistor M2a, M2b, M2c. Only one clamping transistor, i.e. M4 is required, however. Other and more economical alternatives will be described later.

Figure 4:
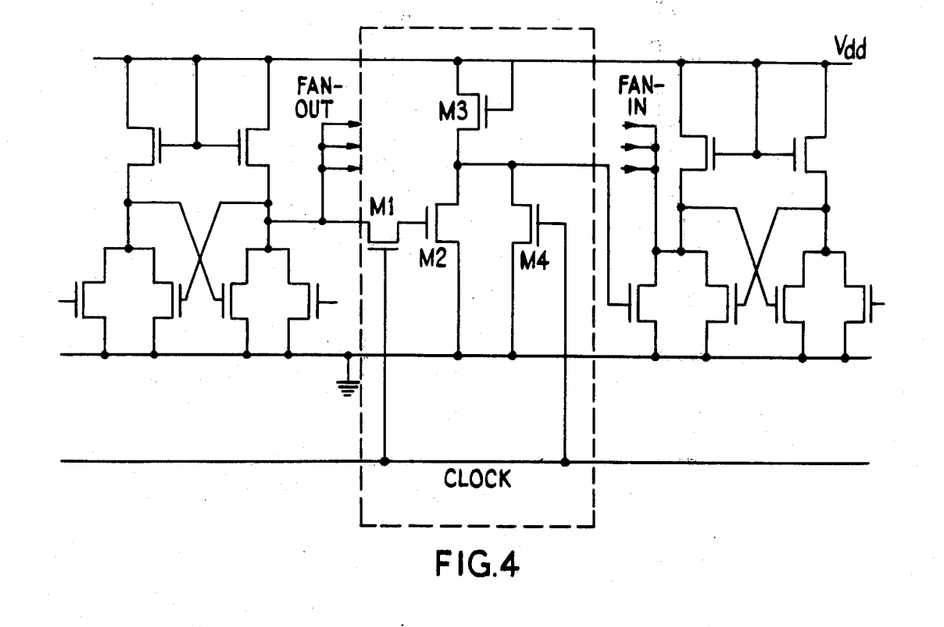
FIG. 4 shows the circuit of FIG. 1 coupling two flip-flops.

FIG. 4 shows how the circuit described with reference to FIG. 1, and contained within the dashed line rectangle, can be employed to couple two flip-flops. The output of the first (left-hand) flip-flop is sampled while the clock is up, and the second (right-hand) flip-flop is triggered when the clock falls.

The arrangement described so far illustrates basic principles and the rules for converting these principles into practice are as follows:

1. It is necessary and sufficient for one transfer device, e.g. transistor M1, and one clamping device, e.g. transistor M4, to be incorporated (in that order) in any logic path between the output of any flip-flop and the input of the next flip-flop in the sequence.

2. The transfer and clamping devices need not be incorporated into the same gate. They can be separated by conventional asynchronous logic as will be more fully described hereinbelow.

3. As a general rule, the number of extra transistors required for synchronizing a logic system will be a minimum when (a) all the transfer devices are driven directly from flip-flop outputs, and (b) all the clamping devices are incorporated in gates which directly feed flip-flop inputs. This follows from the fact that the number of gates can never be less than the number of flip-flops and for random logic the number of gates will usually be greater by a factor of three or four.

4. The "high" (quiescent) clock condition must persist for sufficient time to allow all transitions in the longest logic chain to be completed, and the "low" clock condition must persist for sufficient time to allow the slowest flip-flop to change state.

Returning to FIG. 4, a high fan-out would necessitate a large number of transfer devices (M1) being connected to the flip-flop output concerned. The major problem with this is that when the clock pulse transits from low to high, the voltage at the flip-flop output will be seriously reduced by charge sharing. Recharging through the transfer devices will be slow unless the W/L of the flip-flop load is increased (with a corresponding increase in area, dissipation and input capacitance of the whole flip-flop).

Figure 5:
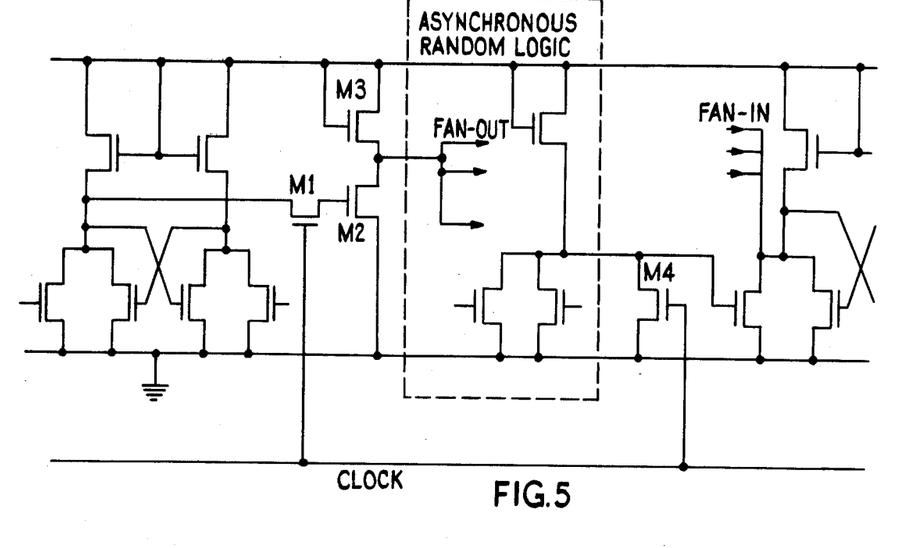
FIG. 5 shows an alternative circuit arrangement coupling two flip-flops.

One way of avoiding this problem, shown in FIG. 5, is to buffer the output of a single transfer device M1 and then use it to drive the required fan-out on an asynchronous basis. In this arrangement, M1 is driven from the other side of the first flip-flop to correct for inversion. Utilization of a single transfer device as just described has a number of advantages. Firstly, it solves the charge-sharing problem. Secondly, it enables the increased area and power dissipation associated with a large fan-out to be restricted to the inverter. Thirdly, it reduces the number of transfer devices and associated clock connections to one.

Finally, the arrangement shown in FIG. 5 avoids the restraint in clock rise time discussed earlier in connection with FIGS. 1 and 2. In that case, it was the high-to-low transit of point X which was significant, and under each circumstances even minute drain-source currents in the transfer device would eventually discharge the gate completely, given enough time. In FIG. 5, the significant transition is low-to-high (due to the extra stage of inversion), and not only is this slower but, more importantly, the actual voltage asymptote is linked to and always less than the instantaneous clock level. This means that it is a relatively simple matter to choose transistor geometries which prevent any unwanted change in output, even for infinitely slow transitions.

Figure 6:
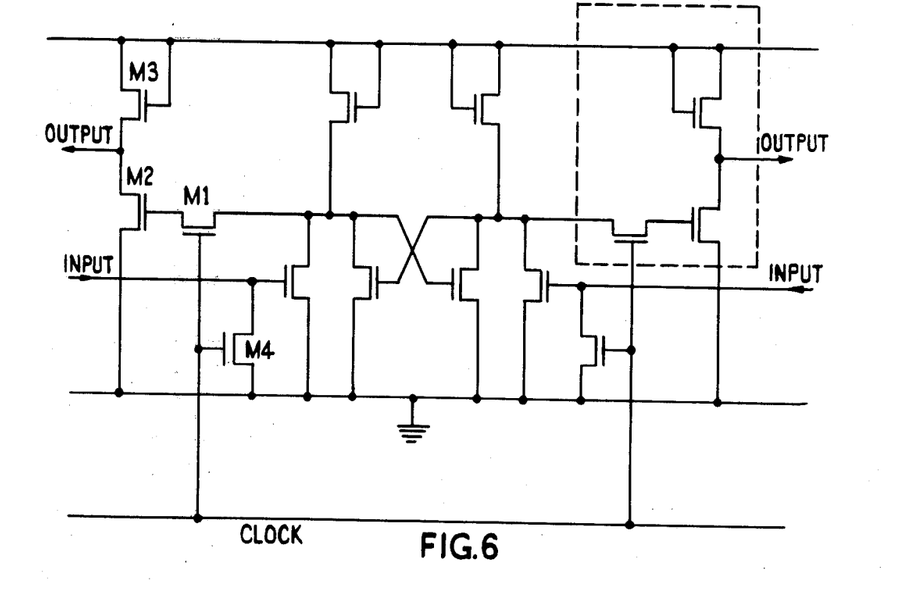
FIG. 6 shows a flip-flop incorporating the synchronizing circuit.

It is evident from FIG. 5 that the synchronizing elements M1 to M4 can all be combined with the flip-flop, in which case the gating operates on a non-synchronous, or D.C. basis. FIG. 6 shows a R-S flip-flop wherein the element M1 to M4 are so incorporated. A full symmetrical arrangement is shown, but the portion within the dashed line rectangle can be ommitted if output is only required from one side of the flip-flop, i.e. the left-hand side of FIG. 6.

Figure 11:
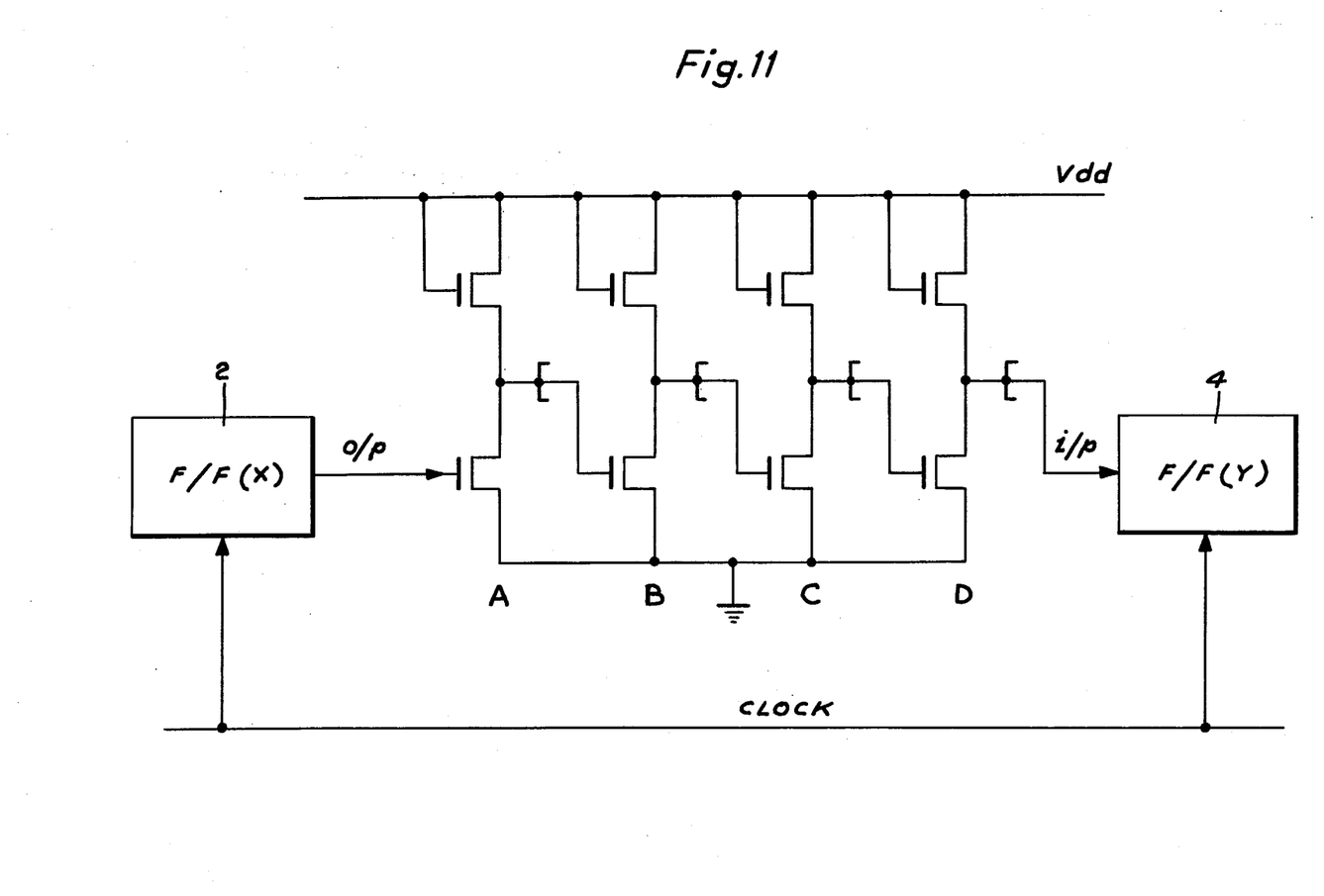
FIG. 11 shows a conventional asynchronous logic circuit

As stated previously, the transfer and clamping devices need not be incorporated into the same gate but may be separated by conventional asynchronous logic. This is illustrated in FIG. 11. Blocks 2 and 4 contain the apparatus shown in FIG. 6, each having transfer devices associated with their outputs and clamping devices associated with their inputs. Four simple inverters, A,B,C and D, are introduced between F/F(X) and F/F(Y). Clearly, this is logically identical with direct connection between the output of F/F(X) and the input of F/F(Y), the only difference being the introduction of a time delay in the interconnection path. However, any one or all of the inverters A,B,C and D in FIG. 11 can be converted into logic gates by the addition of further transistors between any output point and ground. In the latter case, the logic level presented to the input of F/F(Y) will depend on whether the further transistors are conducting or not. Proper choice of control signals to the further transistors permit the generation of complex logic functions. For correct operation of such an arrangement, it is necessary that the control signals to the further transistors change in synchronism with the transition of the clock waveform from "low" to "high." This can be conveniently achieved by generating the control signals (either directly or via other inverters or gates) from transfer devices as previously described.

Figure 7:
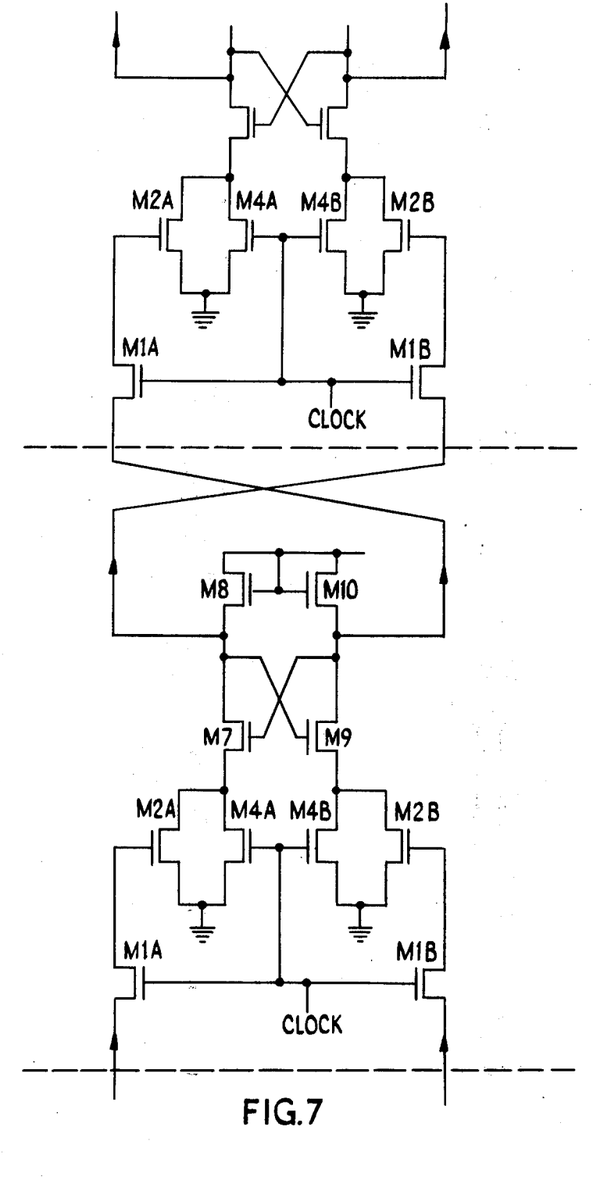
FIG. 7 shows another form of flip-flop incorporating the synchronizing circuit.

Although a possible shift register configuration was shown in FIG. 4, a more economical arrangement can be constructed by combining the three basic elements M1 (transfer device), M2 (input storage device), and M4 (clamping device) with the flip-flop as shown in FIG. 7.

When the clock is high, the input gates are clamped by M4A and M4B and the flip-flops are isolated from the effects of changes in the gate potentials of M2A and M2B. When the clock is low, the clamping path is opened, and the flip-flops assume states determined by the charge stored at the gates of M2A and M2B. Reapplication of the clamp then stabilizes the new states.

Figure 8:
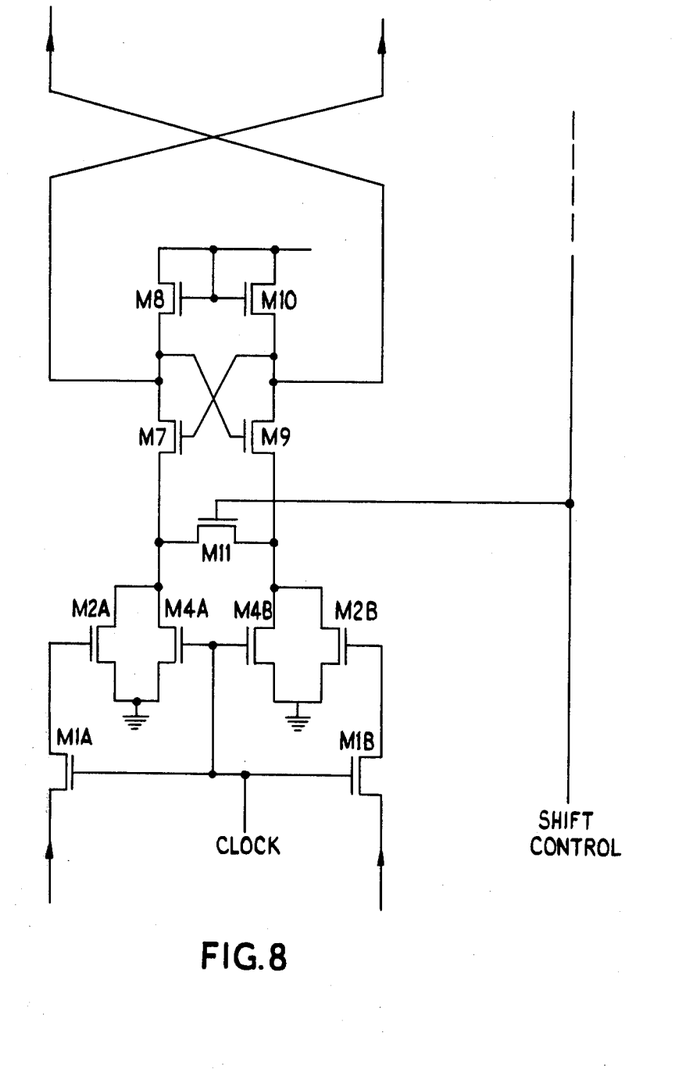
FIG. 8 shows a modified version of the arrangement shown in FIG. 7.

An added feature is the ease with which shifting can be controlled by a logic waveform applied to an additional transistor M11 in the flip-flops as shown in FIG. 8. This relies on the fact that either M2A or M2B will be conducting when the clock is low and in either case a high level at the gate of M11 during this time will prevent the flip-flop from changing state.

Figure 9:
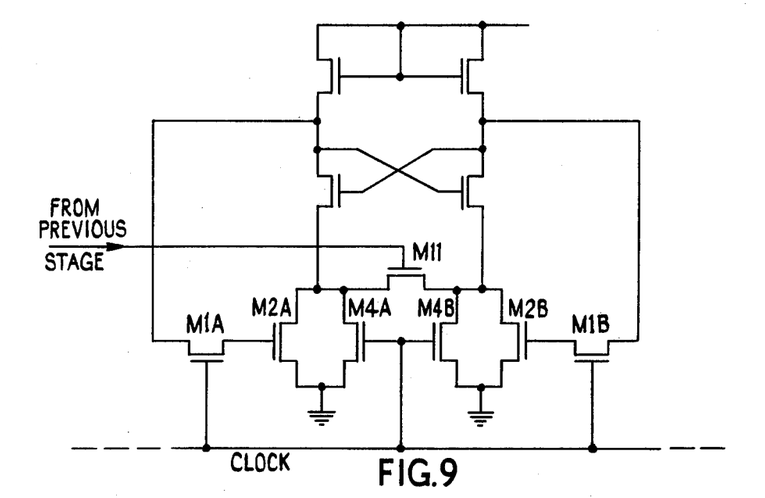
FIGS. 9 and 10 show binary counting stages.
Figure 10:
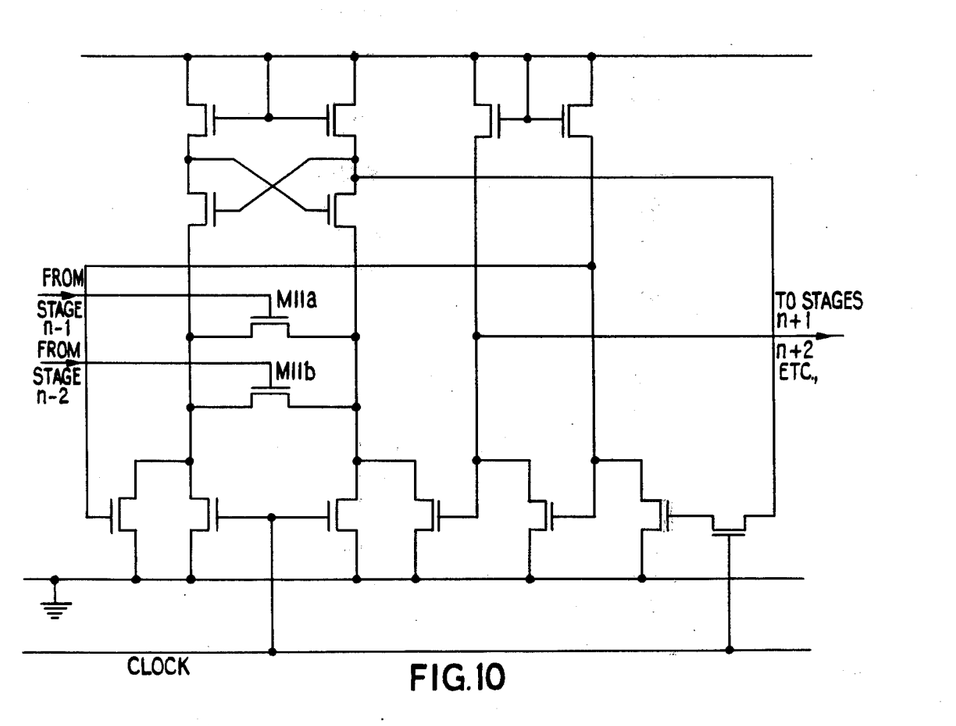

A binary counting stage can be formed by conventional internal feedback as shown in FIGS. 9 and 10. In this case, transistor M11 acts as an additional gate input which enables one stage to be controlled by another, thus allowing fully synchronous counters (as opposed to the "ripple" type) to be constructed simply.

The circuits which have been described, all realizable as MOS integrated circuits, enable full synchronism of MOS logic, shift registers and counters to be achieved economically with a single phase clock. The combination of static and dynamic storage allows operation at clock frequencies down to zero with non-critical circuitry. All the synchronizing elements can be incorporated into a simple flip-flop, with the remainder of the logic operating on a static basis.

It is to be understood that the foregoing description of specific examples of this invention is made by way of example only and is not to be considered as a limitation on its scope.

What is claimed is:

1. A logic transfer circuit including at least two switching devices controlled by a single phase clock, comprising:
   a first switching device;
   a second switching device;
   means for applying a single phase clock pulse waveform to said first and second switching devices for simultaneously switching said first and second switching devices;
   at least one logic input storage device;
   means for coupling an input logic signal to said logic input storage device via said first switching device when said first switching device is conducting, said storage device maintaining an input level transferred thereto during any one conducting period of said transfer circuit throughout the next non-conducting period when said storage device is isolated from said logic input;
   logic output means controlled by said storage device and clamped by said second switching device such that if any change occurs in the input level during any one of said non-conducting periods, said output means is clamped at the pre-change level until the next non-conducting period; and
   asynchronous logic means coupled between said first and second switching devices.

2. A logic transfer circuit according to claim 1 wherein said storage device consists of a capacitance.

3. A logic transfer circuit according to claim 1 wherein said storage device is an MOS transistor.

4. A logic transfer circuit according to claim 3 wherein said first and second switching devices are MOS transistors.

5. A logic transfer circuit according to claim 4 including a plurality of logic input storage devices coupled to logic input signals via a plurality of individual transfer devices and including a single clamping device.

6. A logic transfer circuit according to claim 3 further including a pair of flip-flops coupled together by said logic transfer circuit.

7. A logic transfer circuit according to claim 6 wherein there is a fan-out in said synchronous logic of the output from the flip-flop forming the input to the transfer device.

8. A logic transfer circuit according to claim 7 further including a separately controllable switching device connected across the input subsequent to the transfer circuits.

9. A logic transfer circuit including at least two switching devices controlled by a single phase clock, comprising:
   a first switching device;
   a second switching device;
   means for applying a single phase clock pulse waveform to said first and second switching devices for simultaneously switching said first and second switching devices;
   at least one logic input MOS storage transistor;
   means for coupling an input logic signal to said logic input storage device via said first switching device when said first switching device is conducting, said storage transistor maintaining an input level transferred thereto during any one conducting period of said transfer circuit throughout the next non-conducting period when said storage transistor is isolated from said logic input;
   logic output means controlled by said storage transistor and clamped by said second switching device such that if any change occurs in the input level during any one of said non-conducting periods, said output means is clamped at the pre-change level until the next non-conducting period;
   a pair of flip-flops coupled together by said logic transfer circuit; and
   asynchronous logic means coupled between said first and second switching devices.

* * * * *